United States Patent

Endo

Patent Number: 5,494,206
Date of Patent: Feb. 27, 1996

[54] WIRE BONDING METHOD AND APPARATUS

[75] Inventor: Takashi Endo, Tokyo, Japan

[73] Assignee: Kabushiki Kaisha Shinkawa, Tokyo, Japan

[21] Appl. No.: 250,922

[22] Filed: May 31, 1994

[30] Foreign Application Priority Data

Jun. 11, 1993 [JP] Japan ................................ 5-164987

[51] Int. Cl.$^6$ ................................................ B23K 37/00
[52] U.S. Cl. ........................ 228/102; 228/8; 228/56.5
[58] Field of Search ........................... 228/180.5, 4.5, 228/102, 8, 56.5, 54

[56] References Cited

U.S. PATENT DOCUMENTS

| | | | |
|---|---|---|---|
| 3,909,301 | 9/1975 | Schenk, Jr. | 228/58 |
| 4,572,421 | 2/1986 | Hug et al. | 228/180.5 |
| 4,759,073 | 7/1988 | Shah et al. | 228/180.5 |
| 4,789,095 | 12/1988 | Kobayashi | 228/4.5 |
| 5,020,715 | 6/1991 | Kimura et al. | 228/180.5 |

FOREIGN PATENT DOCUMENTS

| | | | |
|---|---|---|---|
| 57-58054 | 12/1982 | Japan. | |
| 58-55663 | 12/1983 | Japan. | |
| 2-215139 | 8/1990 | Japan | 228/180.5 |

*Primary Examiner*—P. Austin Bradley
*Assistant Examiner*—Jeffrey T. Knapp
*Attorney, Agent, or Firm*—Koda and Androlia

[57] ABSTRACT

A proper replacement time to exchange a used bonding tool with a new one in a wire bonder is accomplished by a method and apparatus that includes a contact detector which detects the bonding tool contacting a bonding surface, a counter which counts the number of contacts of the bonding tool with the bonding surface, a use number setting device in which a number of times that the bonding tool is to be used and then replaced inputted, and a judgment device which judges whether or not the contacting number of the bonding tool has reached the set number inputted in the use number setting device. When the counted number reaches the set number or when the bonding tool is used the number of set times, a warning signal is outputted and the operation of the wire bonder is stopped for the bonding tool replacement.

4 Claims, 1 Drawing Sheet

5,494,206

WIRE BONDING METHOD AND APPARATUS

BACKGROUND OF THE INVENTION

1. Field of the Invention

The present invention relates to a wire bonding method and apparatus and more particularly to a method and apparatus that gives a notice of the time of replacement of a used bonding tool in a wire bonding machine.

2. Prior Art

Conventionally, the time of bonding tool replacement in wire bonders has been determined by an operator's visual observation of the results or the quality of wire bonding. Signs of need of the bonding tool replacement are frequent wire breakage, an uneven diameter of the bonded balls, a drop in the bonding strength, etc.

Since the need for the replacement of the bonding tool is determined by visual inspection, it is difficult to make a proper judgment of the replacement time. If the bonding tool is not replaced with a new one at a proper time, defective products would be generated.

SUMMARY OF THE INVENTION

Accordingly, the object of the present invention is to provide a wire bonding method and apparatus which make it possible to ascertain the correct tool replacement time automatically, so that working efficiency can be improved and the generation of defective products can be prevented with no need for the operator to monitor the tool replacement time.

The object of the present invention is accomplished by a unique method that includes the steps of counting the number of times that a bonding tool comes into contact with a bonding surface, and then detecting whether or not the counted number reaches a preset number.

The object of the present invention is accomplished also by a unique structure in a wire bonder which includes a contact detector that detects the contact of a bonding tool with a bonding surface, and the unique structure comprises: a counter which counts the number of times that the contact detector performs detection, a use number setting means for setting the number of times that the bonding tool is used, and a judgment means which judges whether or not the number of times counted by the counter has reached the number of times set in the use number setting means.

The number of times that the bonding tool is to be used is set in the use number setting device, and the umber of times that the bonding tool actually contacts the bonding surface during the bonding action is counted. When the number of times of the bonding tool contacting with the bonding surface reaches the number which has been set in the setting device, it is judged that it is time to replace the bonding tool. Thus, the proper time for tool replacement can be ascertained automatically, and there is no need for the operator to monitor the replacement time. In addition, working efficiency can be improved, and the generation of defective products can be avoided.

DETAILED DESCRIPTION OF INVENTION

Figure 1:
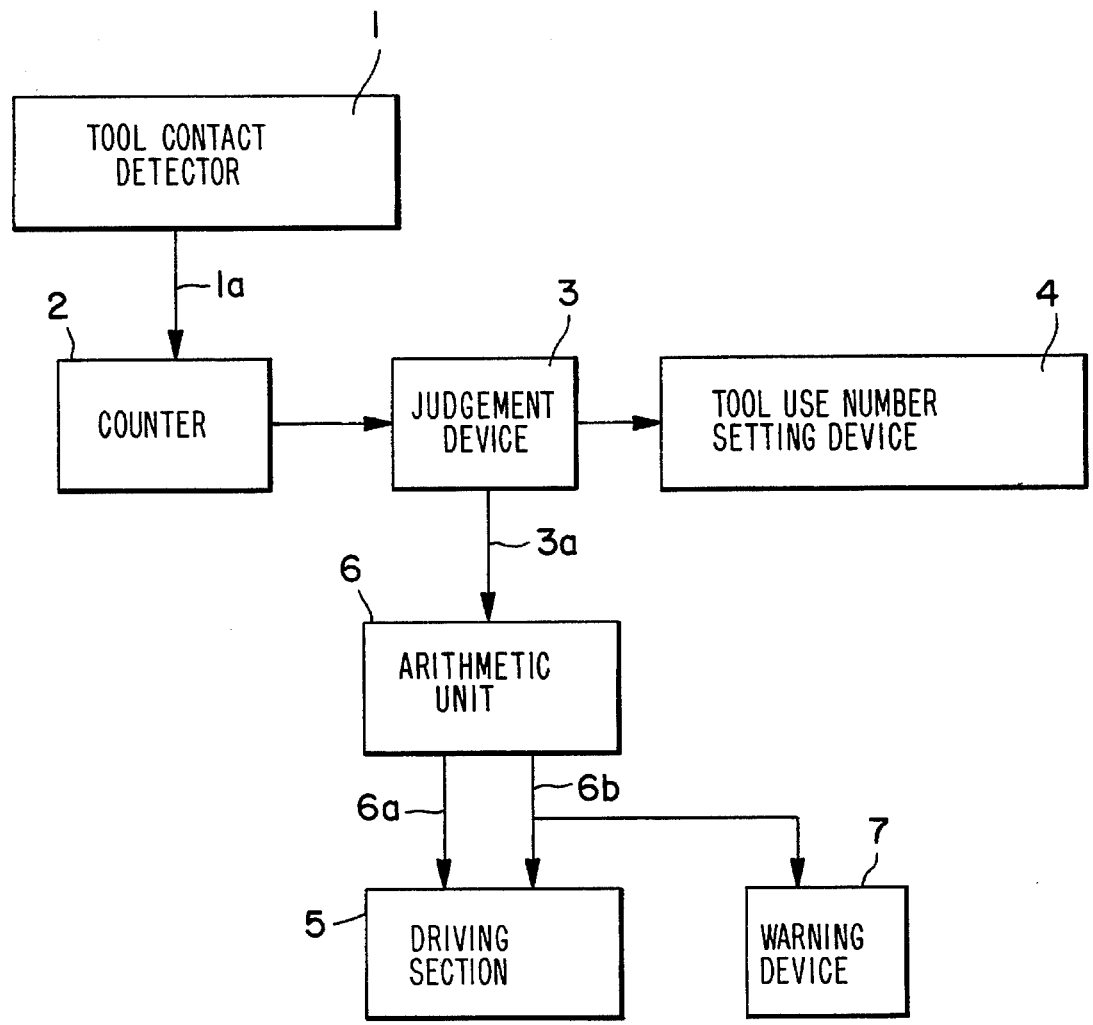
FIG. 1 is a diagram which shows the system layout of one embodiment of the present invention.

First, before an embodiment of the present invention is described, an explanation of a conventional wire bonding apparatus in which the present invention is applicable will be given. In other words, a type of wire bonder in which the method and apparatus of the present invention is used will be described first.

The wire bonder includes a system wherein each time the bonding tool comes into contact with a bonding surface, the contact is detected by a contact detector. More precisely, the present invention is utilized in a wire bonder in which each time the wire or a ball formed at the tip of the wire contacts the bonding surface, such contacts are counted by a tool contact detecting means. This type of wire bonder is disclosed, for instance, in the Japanese Patent Application Publication ("Kokoku") Nos. 57-58054 and 58-55663.

In these wire bonder systems, the contact of the bonding wire with the bonding surface is detected as a result of the separation of two detection terminals or detectors which are kept in contact and then separated when the bonding tool contacts the bonding surface.

In another known system, when the bonding tool comes into contact with the bonding surface, the lowering motion of a tool arm to which the bonding tool is attached stops though the lowering motion of a lifter arm which drives the tool arm continues; as a result, the gap between the tool arm and the lifter arm changes, and this change in the gap space is detected by a detector.

The embodiment of the present invention will be described below with reference to the systems referred to above which use the detectors.

As seen in FIG. 1, the tool contact detector 1 is connected to a counter 2 which is connected to a judgment device 3, which is a comparator. A tool use number setting device 4 in which the number of times that a bonding tool is to be used is connected to the judgment device 3. A judgment result produced by the judgment device 3 is sent to an arithmetic or control unit 6, which is a computer, etc. so that the arithmetic unit 6 controls a driving section 5 of the wire bonder. The arithmetic unit 6 is connected to a warning device 7.

In operation, the number of times which the bonding tool is to be counted is set beforehand in the tool use number setting device 4. Generally, bonding tools for a wire bonder are used 300,000 times. Accordingly, this number, for example, is set or inputted in the tool use number setting device 4 as a number of use of the bonding tool. After the setting, bonding is performed via the driving section 5 which is commanded by the arithmetic unit 6.

Each time the bonding is performed or each time the bonding tool comes into contact with a bonding surface, a tool contact signal 1a is outputted from the tool contact detector 1 to the counter 2, and the number of times of the bonding or the contact is stored in the counter 2. The judgment device 3 compares the number of times counted by the counter 2 with the number of times set in the tool use number setting device 4.

Before the number of times counted by the counter 2 has reached the number of times set in the setting device 4, no signal is outputted from the judgment device 3, and the bonding operation is continued in accordance with the driving signal 6a from the arithmetic unit 6.

When the number of times counted by the counter 2 reaches the number of times set in the tool use number setting device 4 by the comparison done by the judgment device 3, the judgment device 3 sends a count-up signal 3a to the arithmetic unit 6. Upon this signal, the arithmetic unit 6 outputs a stop signal 6b which is for stopping the operation of the bonder via the driving section 5 and also for giving out a warning signal from the warning device 7. As a result, the bonding operation of the bonder Stops, and the operator is informed that the operation of the bonder is stopped. Thus, the operator can replace the used bonding tool with a new one.

As described above, according to the present invention, the number of times that the bonding tool is to be used is set in the tool use number setting device, and the number of times that the bonding tool actually contacts the bonding surface is counted and compared with the set number inputted in the tool use number setting device 4. When these numbers are judged to be equal, it is time to replace the used bonding tool.

Accordingly, the proper time for tool replacement can be notified to the operator by the signals issued by the warning device and the bonding action of the wire bonder can be automatically stopped by the driving section 5. As a result, working efficiency can be improved, and the generation of defective products can be avoided without any need for the operator to cautiously monitor the replacement time.

I claim:

1. A wire bonding method characterized in that said method comprises the steps of: counting a total number of times that a bonding tool contacts a bonding surface, and detecting whether or not said counted number reaches a number of times that indicates a need to replace said bonding tool.

2. A wire bonding apparatus comprising a contact detector which detects when a bonding tool contacts a bonding surface, said apparatus further comprising: a counter which counts a total number of times of detection performed by said tool contact detector, a tool use number setting means in which a number of times which said bonding tool is to be used and the replaced is set, and a judgment means which judges whether or not said total number of times counted by said counter has reached said number of times set in said tool use number setting means.

3. A wire bonding apparatus comprising:

a contact detector which detects a bonding tool coming into contact with a bonding surface;

a counter which is connected to said contact detector so as to count the number of contacts of said bonding tool has made with said bonding surface since the bonding tool was replaced;

a tool use number setting means in which a number of times that said bonding tool to be used and then replaced is inputted; and a judgment means to which said counter and said tool use number setting means are connected, said judgment means judging whether or not a counted number which is counted by said counter has reached said number inputted in said tool use number setting means.

4. A wire bonding apparatus according to claim 3, wherein said judgment means is connected to a driving section and a warning means via a control unit, said driving section controlling an operation of said bonding apparatus and said warning means giving out a warning signal.

* * * * *